United States Patent
Cline

(10) Patent No.: US 8,330,517 B1
(45) Date of Patent: Dec. 11, 2012

(54) BISTABLE CIRCUIT WITH METASTABILITY RESISTANCE

(75) Inventor: Ronald L. Cline, Tijeras, NM (US)

(73) Assignee: Xilinx, Inc., San Jose, CA (US)

( * ) Notice: Subject to any disclaimer, the term of this patent is extended or adjusted under 35 U.S.C. 154(b) by 78 days.

(21) Appl. No.: 12/974,151

(22) Filed: Dec. 21, 2010

(51) Int. Cl.
*H03K 3/289* (2006.01)

(52) U.S. Cl. .................................................. 327/203

(58) Field of Classification Search .................. None
See application file for complete search history.

(56) References Cited

U.S. PATENT DOCUMENTS

| | | |
|---|---|---|
| 5,789,945 A | 8/1998 | Cline |
| 2008/0048745 A1* | 2/2008 | Mo .............................. 327/203 |

\* cited by examiner

*Primary Examiner* — Lincoln Donovan
*Assistant Examiner* — Sibin Chen
(74) *Attorney, Agent, or Firm* — LeRoy D. Maunu

(57) ABSTRACT

A method and circuit for operating a bistable latch are provided. The state of input data is latched on a first edge of a clock signal. In response to every first edge of the clock signal, a control circuit causes power boost circuit to couple first and second complementary output nodes of the bistable latch to a power source. In response to detecting stable operation of the bistable circuit, the control circuit causes power boost circuit to decouple the first and second complementary output nodes from the power source.

20 Claims, 5 Drawing Sheets

BISTABLE CIRCUIT WITH METASTABILITY RESISTANCE

FIELD OF THE INVENTION

One or more embodiments generally relate to circuits having one or more metastable states.

BACKGROUND

A clocked bistable circuit, such as a latch device or flip-flop, may require an indeterminate amount of time to generate a valid output when switching states. When input changes randomly with respect to the clock driving the digital circuit, such as when asynchronous input is received, there is a small probability that the output will exhibit an unpredictable delay. This happens when the input transition not only violates the setup and hold-time specifications, but also occurs within the window of time when the digital circuit accepts the new input. Under these circumstances, the bistable circuit can enter a balanced transitory state, called a metastable state.

A metastable state is not stable, and eventually a small deviation from an equal balance will cause the output to revert to one of the stable states. The time required for the circuit to resolve to a stable state depends on the metastability time-constant, tau (i), and is the dominant factor in determining the mean time between failures (MTBFs).

Tau of a specific circuit depends on several characteristics, such as the parasitic capacitances in the circuit, the gate lengths of the transistors, etc. Tau is generally proportional to the amount of energy expended per unit time while resolving to one of the two stable operating states. This is reflected in a power-supply-related term for tau. Low voltage levels of a device may cause tau recovery time to increase and can be a significant problem for mobile and other battery operated devices.

For example, in a CMOS bistable latch, there is a dependence on MOS transistor thresholds for CMOS circuits of the form:

$$\text{Tau} \approx \text{Constant}/(V_{supply} - 2*V_{th})^N$$

where $V_{supply}$ is the supply voltage to the latch circuit, $V_{th}$ is the threshold voltage, and N is an exponential factor between 1 and 2. As $V_{supply}$ is reduced toward ($2*V_{th}$), tau increases. As process geometries shrink, supply voltages are decreased to increase power efficiency, and as clock speeds are increased, the impact of metastability becomes more significant.

Some methods attempt to compensate for latch metastablity by implementing several latches in series, thereby transferring the decision of one latch to the next. These solutions may simply transfer a potential metastable state from one latch to the next, allowing more time for resolution, but they also insert extra clock delays (latency) in the system which are often undesired.

SUMMARY

In one embodiment, a circuit having improved resistance to metastable conditions is provided. The circuit includes a bistable circuit having first and second complementary output nodes and is configured to latch a state of input data on a first edge of a clock signal. A metastability correction circuit is coupled to the bistable circuit and includes a power boost circuit and a control circuit. The power boost circuit is configured to couple the first and second complementary output nodes of the bistable circuit to a power source in response to an enable signal. The first and second output nodes are coupled to the power source in response to a first state of the enable signal. The first and second output nodes are decoupled from the power source in response to a second state of the enable signal. The control circuit is configured to assert the enable signal in the first state in response to each first edge of the clock signal and assert the enable signal in the second state in response to detecting stable operation of the bistable circuit.

In another embodiment, a metastable state-resistant logic circuit is provided. The logic circuit exhibits two or more stable states and is subject to one or more metastable states. The logic circuit is configured to set an output state of the logic circuit on a first edge of a clock signal. A metastability correction circuit is coupled to the logic circuit and includes a power boost circuit and a control circuit. The power boost circuit is configured to couple one or more nodes of the logic circuit to a power source in response to an enable signal. The one or more nodes are coupled to the power source in response to a first state of the enable signal and are decoupled from the power source in response to a second state of the enable signal. A control circuit is configured to assert the enable signal in the first state in response to every first edge of the clock signal and assert the enable signal in the second state in response to detecting stable operation of the bistable circuit.

In yet another embodiment, a method of operating a bistable latch is provided. The state of input data is latched on a first edge of a clock signal. In response to every first edge of the clock signal, first and second complementary output nodes of the bistable latch are coupled to a power source. In response to detecting stable operation of the bistable circuit, the first and second complementary output nodes of the bistable circuit are decoupled from the power source.

It will be appreciated that one or more other embodiments are set forth in the Detailed Description and Claims, which follow.

BRIEF DESCRIPTION OF THE DRAWINGS

Various aspects and advantages of one or more embodiments will become apparent upon review of the following detailed description and upon reference to the drawings, in which:

FIGS. 4-1 shows a timing diagram of a recovery period from metastable state exhibited by a typical bistable latch circuit;

FIGS. 4-2 shows a timing diagram of a recovery period from metastable state exhibited by a bistable latch circuit implemented with metastability correction circuitry.

DETAILED DESCRIPTION

Tau is inversely proportional to the transconductance (Gm) of the transistors in a bistable circuit which is in a metastable state. Tau is reduced when the gain or transconductance (Gm) is increased and may be improved by providing a localized increase in electrical power of the digital circuit after a metastable state is detected. However, detection of a metastable state with standard CMOS circuitry is problematic, especially in low supply voltage conditions, where metastability is likely to occur, as metastable states are naturally associated with signal voltages which are not standard logic levels.

One or more embodiments present a circuit and method to improve recovery time of a bistable circuit from a metastable state. At the beginning of the time period in which a circuit may become metastable, such as the first edge of a clock signal used to drive the circuit, the circuit assumes that the circuit is in a metastable state and boosts the power consumption. If the bistable circuit is in a metastable state, the boost circuit will remain engaged. When the circuit recovers from metastability, a detection circuit disables the boost circuit.

One skilled in the art will recognize that there are a number of digital circuits having two or more stable states that are subject to metastability, such as latch circuits, flip-flops, etc. For ease of illustration, the embodiments are primarily described with reference to a bistable latch circuit.

Figure 1:
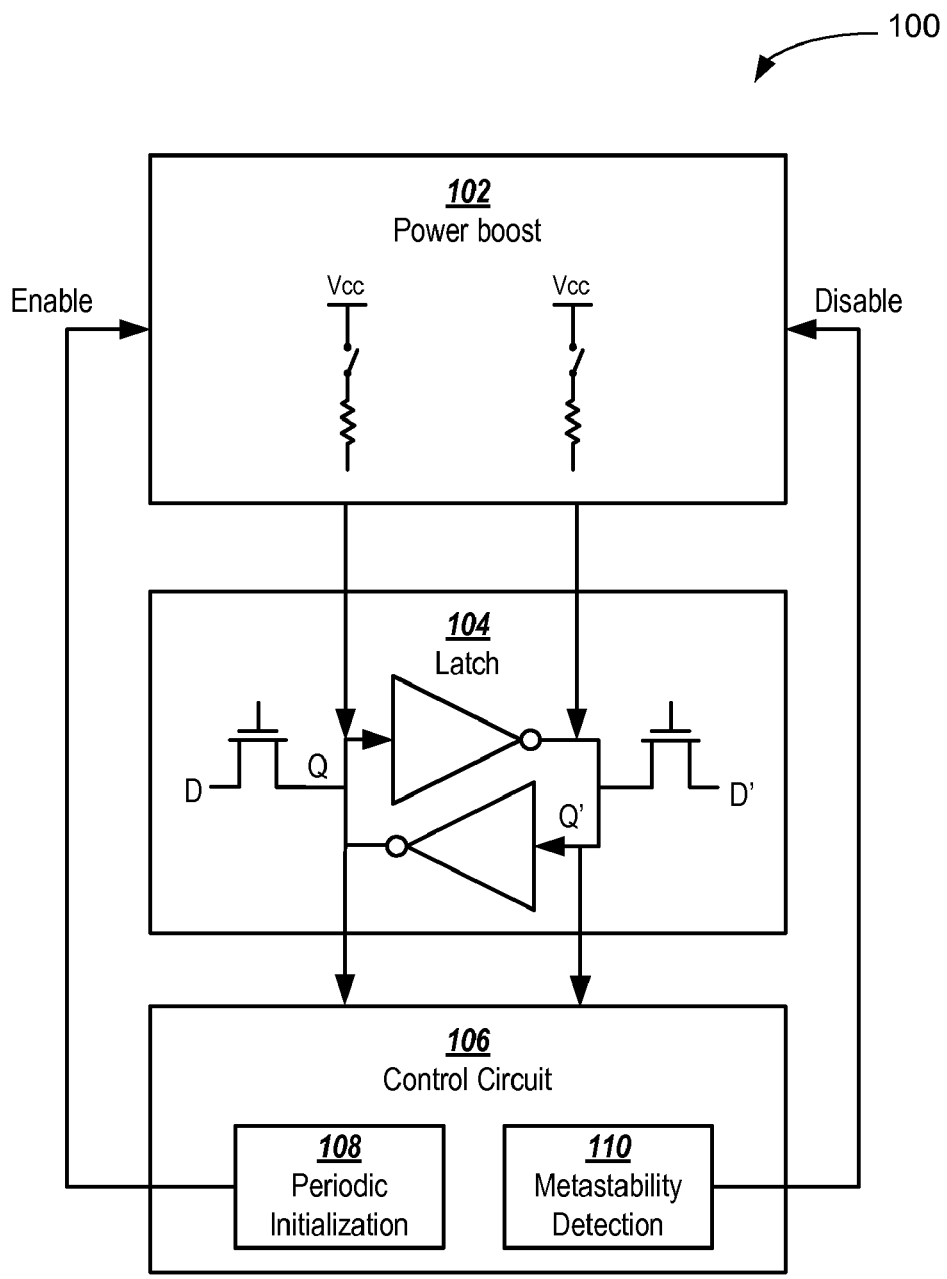
FIG. 1 shows a circuit diagram of an example latch circuit.

FIG. 1 shows a circuit diagram of an example bistable latch circuit. In this example, the latch circuit 104 is a bistable latch subject to one metastable state. A power boost circuit 102 is coupled to nodes Q and Q' of latch 104. When enabled, power boost circuit 102 increases the local power to output nodes Q and Q', which causes tau to decrease. In one implementation, the power boost circuit 102 increases power by coupling each of the output nodes to a power source (Vcc) with a respective resistive path. The resistance of the paths allows the output nodes Q and Q' to deviate from each other and resolve to a stable state. A control circuit 106 is included to enable and disable the power boost circuitry. The control circuit 106 includes a periodic initialization circuit 108, which is configured to enable the power boost circuit 102 during latch hold time to aid in resolving any metastability condition more quickly. The control circuit 106 also includes a metastability detection circuit 110, which is configured to disable the power boost circuit when it detects stable operation.

Figure 2:
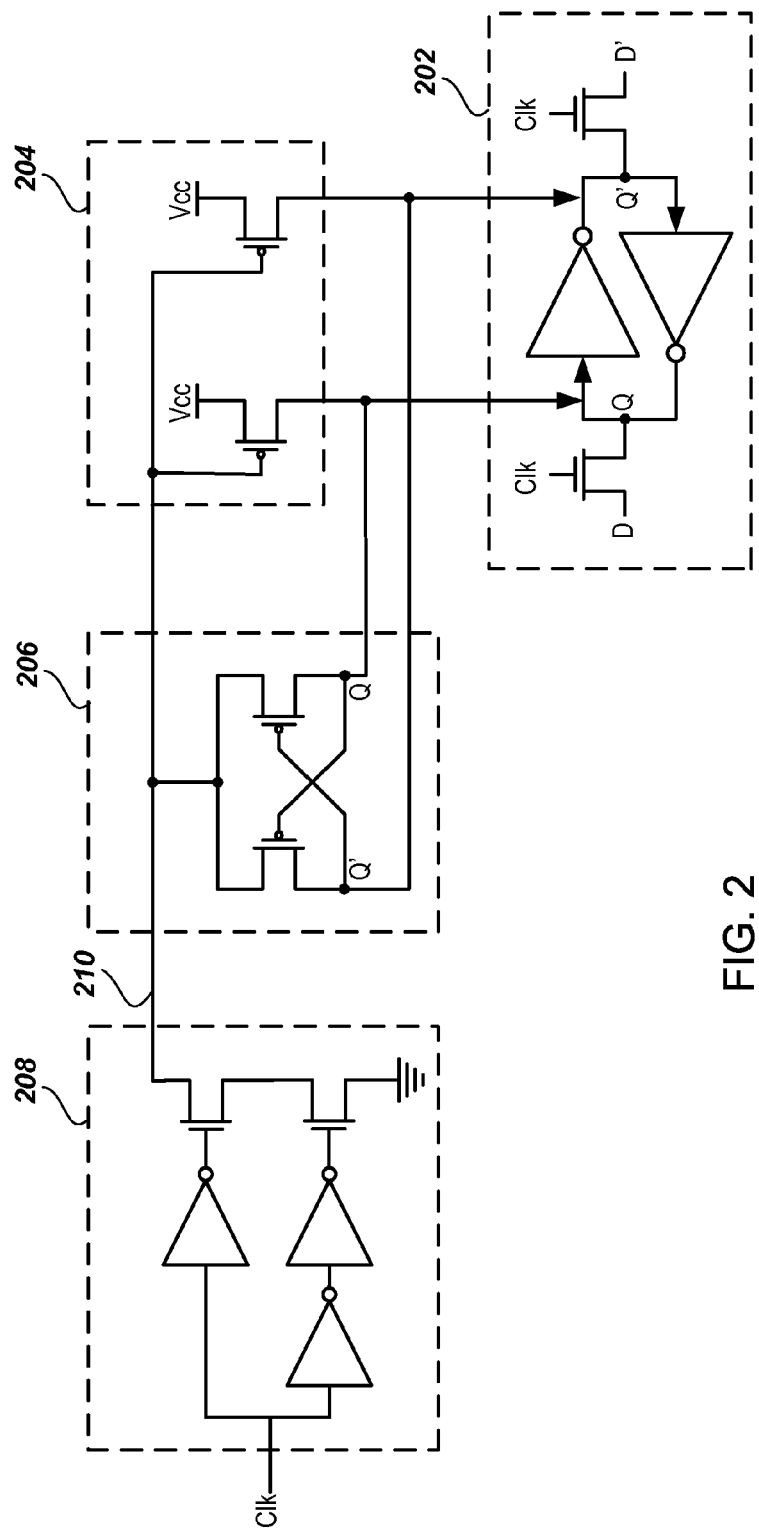
FIG. 2 shows a circuit diagram of an implementation of the latch circuit shown in FIG. 1.

FIG. 2 shows a circuit diagram of an example implementation of the latch, power boost, and control circuits shown in FIG. 1. The lines in the figures are referred to by the signals they carry. Subcircuits 204, 206, and 208 form a metastability correction circuit for the latch 202. On the negative-going active clock edge, the control enable signal 210 is pulled low by control circuit 208. In this example implementation, the control circuit is configured to force the control enable signal 210 low for a minimum duration of one gate delay, thereby forming an enable pulse. In response to the control enable signal 210 being low, the power boost circuit 204 is enabled. In this example implementation the power boost circuit 204 includes first and second transistors configured to respectively couple the first of the complementary output nodes to the Vcc power source when the control enable signal 210 is low.

After one gate delay, the control circuit 208 stops pulling the control enable signal 210 low. The duration of the pulse may be increased or decreased to enable the power boost circuit during the time period in which the latch 202 may enter a metastable state. The control enable signal stays low if the latch has entered a metastable state. In this implementation, there is no pull-up for the control enable signal, as both PMOS transistors of detect circuit 206 are off. At this point, the latch is now in a low-tau, higher power state. The control enable signal 210 continues to stay low until the detector circuit 206 senses the latch 202 has left the metastable state. For example, after $|Q-Q'|>V_{th}$, one of the PMOS transistors of the metastability detector circuit 206 turns on, pulling up the control enable signal 210 and disabling the power boost circuit 204. Once the latch has resolved to one of the bistable states, it will not return to a metastable state until gated by the clock signal to receive another input. The latch 202 returns to its normal low power mode.

In this example the detect circuit 206 is implemented with an XOR gate. A first input (Q) is coupled to the source of a first PMOS transistor and coupled to a gate of a PMOS second transistor. Likewise, a second input (Q') is coupled to the source of the second PMOS transistor and coupled to a gate of the first PMOS transistor. An output of the XOR and detect circuits is formed at a node coupling a second drain of each of the first and second PMOS transistors.

Figure 3:
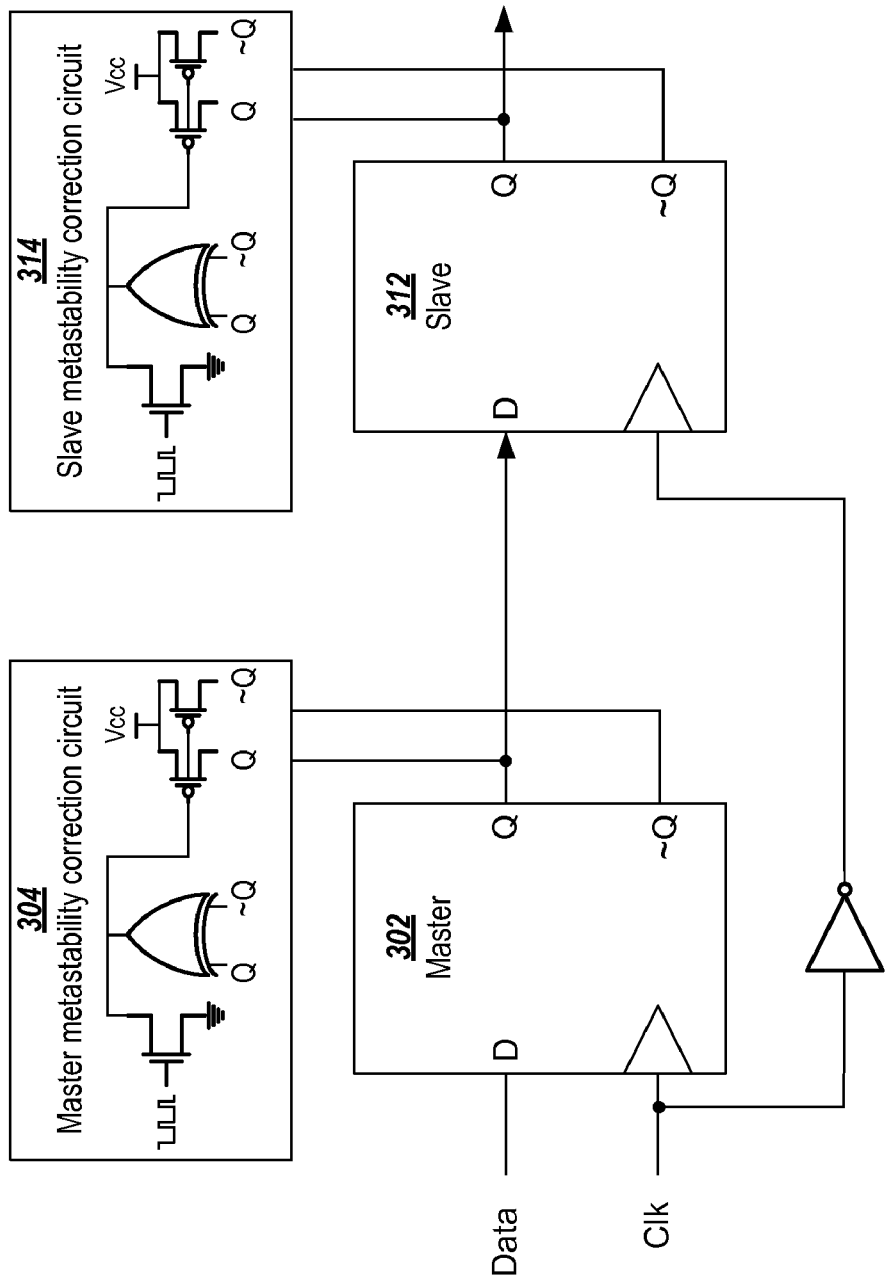
FIG. 3 shows a circuit diagram of a pulse-triggered D flip-flop implemented with metastability correction circuits.

FIG. 3 shows an example pulse-triggered D flip-flop configured with metastability correction circuits as described above. A pulse-triggered D flip-flop includes a master latch circuit 302 coupled in series with a slave latch circuit. The master latch is gated to capture an input on the rising edge of a clock. The clock to the slave is inverted so that the output of the slave latch 312 is updated on the falling edge of the clock. The slave latch 312 receives the output signal of the first stage on the second clock edge and can go into a metastable state only if the master latch 302 is in a metastable state.

Metastability recovery time can be decreased by adding metastability recovery circuits 304 and 314 to one or both of the master and slave latches 302 and 312 as discussed above to reduce tau of the respective circuits 304 and 314. One skilled in the art will recognize that in certain applications metastability recovery circuits may not be needed on both master and slave latches 302 and 314 to resolve metastable conditions. Furthermore, boosting power of the latch circuits 302 and 312 may result in a slight increase in dynamic power consumption. Accordingly, it may be desirable to reduce dynamic power consumption by implementing metastability recovery circuitry on only one of the latch circuits 302 or 312.

Figures 1, 4:
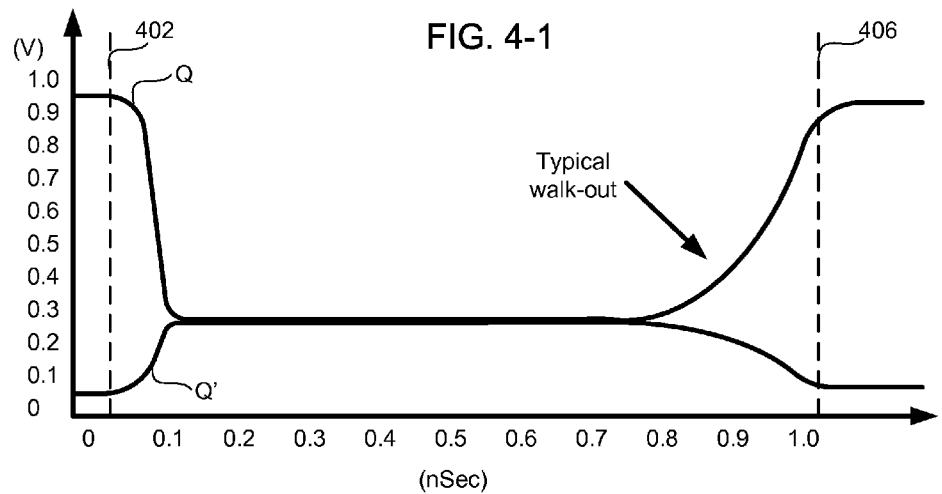
Figures 2, 4:
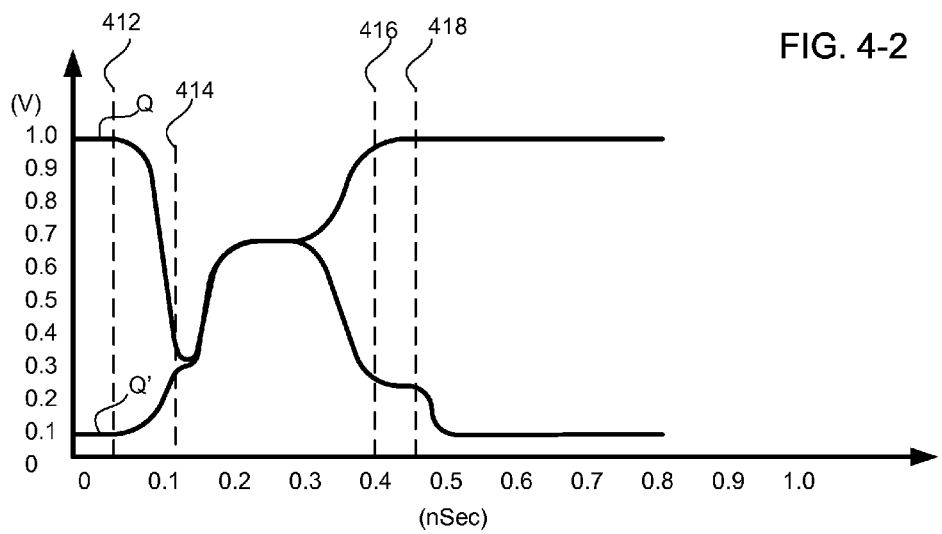

FIGS. 4-1 shows a timing diagram of an example recovery period exhibited by a bistable latch circuit. Upon the latch transition at time 402, the latch may transition into a metastable state where complementary outputs are equal. The latch may stay in the metastable state for an indeterminate period of time before the latch resolves to a stable state at time 406. As discussed above, the resolution time of a specific circuit depends several characteristics such as the parasitic capacitances in the circuit, the gate lengths of the transistors, etc.

FIGS. 4-2 shows a timing diagram of an example recovery period exhibited by a bistable latch circuit with metastability recovery circuitry implemented as described above. Following the latch transition at time 412 the metastability correction circuit boosts power to the bistable latch automatically at time 414. If the complementary outputs Q and Q' are metastable, the power boost circuit increases the voltage level of both complementary inputs as illustrated in the time period following time 414. In response to the increased voltage and increased transconductance, the resolution time of the metastable state is decreased. Shortly, after resolution is complete at time 416, the detection circuit detects a stable state and the power boost circuit is disabled at time 418.

One skilled in the art will recognize that the graphs are provided as illustrative examples. The particular values may not be representative of measurements of a metastable state of an actual circuit implementation.

Figure 5:
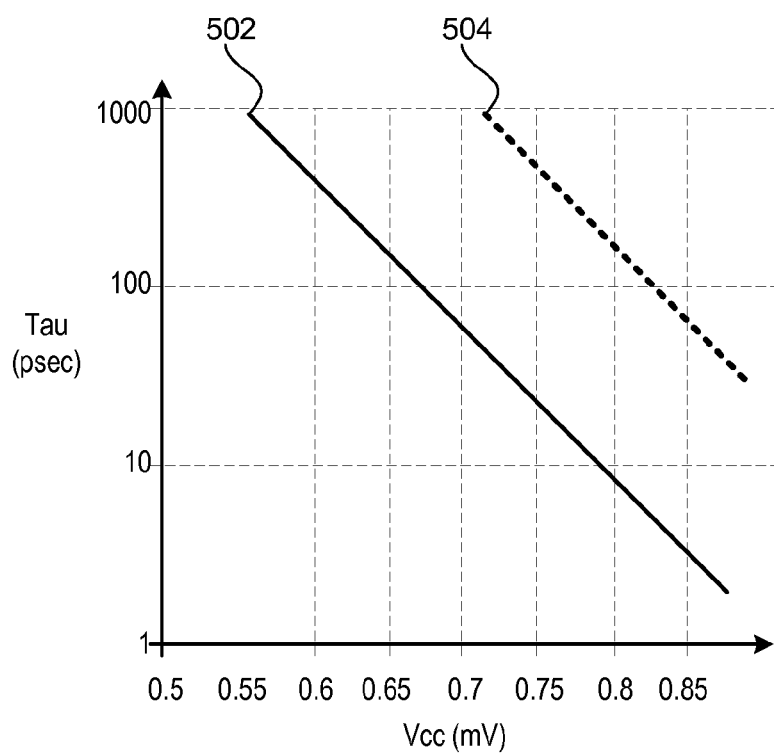
FIG. 5 is a graph illustrating tau improvement provided by the metastability correction circuitry.

FIG. 5 is a graph illustrating the improvement in tau provided by the metastability correction circuitry. The graph illustrates the metastability resolution time at different Vcc voltages. Plots 502 and 504 respectively show tau recovery time periods of a circuit with and without the metastability correction circuitry. As discussed above, as the Vcc decreases the tau of each latch circuit increased. Both Plots 502 and 504 exhibit exponential growth of tau as Vcc is decreased. As seen from a comparison of these graphs, the tau of graph 502 (with metastability correction circuit) is an order of magnitude less than the tau of graph 504 (without metastability correction circuit) at any given Vcc voltage. The plot lines 502 and 504 are provided as examples and may not be proportional to a measured data set.

Although the disclosed embodiments and examples are primarily discussed in relation to bistable circuits, one skilled in the art will recognize the power correction circuits may also be used to improve tau resolution time of circuits having three or more stable states using appropriate detection circuitry to disable the power boost circuits when a stable state is detected.

The embodiments are thought to be applicable to a variety of circuits subject to one or more metastable states. Other aspects and embodiments will be apparent to those skilled in the art from consideration of the specification. The embodiments may be implemented an application specific integrated circuit (ASIC), or as a logic on a programmable logic device. It is intended that the specification and illustrated embodiments be considered as examples only, with a true scope and spirit of the invention being indicated by the following claims.

What is claimed is:

1. A circuit having improved resistance to metastable conditions, comprising:
    a bistable circuit having first and second complementary output nodes and configured to latch a state of input data on a first edge of a clock signal; and
    a metastability correction circuit including:
        a power boost circuit configured to couple the first and second complementary output nodes of the bistable circuit to a power source in response to an enable signal;
        wherein the first and second output nodes are coupled to the power source in response to a first state of the enable signal;
        wherein the first and second output nodes are decoupled from the power source in response to a second state of the enable signal; and
        a control circuit configured to:
            detect whether operation of the bistable circuit is stable or unstable; and
            assert the enable signal in the first state in response to each first edge of the clock signal and assert the enable signal in the second state in response to detecting stable operation of the bistable circuit.

2. The circuit of claim 1, wherein the control circuit includes:
    a metastability state detection circuit; and
    a one shot pulse generator having a trigger input coupled to receive the clock signal.

3. The circuit of claim 2, wherein the control circuit further includes a transistor configured to pull down the enable signal to the first state in response to a pulse generated by the one-shot pulse generator.

4. The circuit of claim 2, wherein the one-shot pulse generator circuit is configured to generate a pulse on each first edge of the clock signal.

5. The circuit of claim 2, wherein the metastability state detection circuit comprises an XOR gate having two inputs respectively coupled to the first and second complementary output nodes.

6. The circuit of claim 5, wherein the XOR gate is configured to have an open output when inputs of the XOR circuit are in a metastable state.

7. The circuit of claim 5, wherein the XOR gate includes:
    a first input coupled to a first source/drain of a first transistor and coupled to a gate of a second transistor;
    a second input coupled to a first source/drain of the second transistor and coupled to a gate of the first transistor; and
    an output coupled to a second source/drain of each of the first and second transistors.

8. The circuit of claim 1, wherein the power boost circuit includes:
    a first transistor configured to selectably couple the first of the complementary output nodes to a power source in response to the first state of the enable signal; and
    a second transistor configured to selectably couple the second of the complementary output nodes to the power source in response to the first state of the enable signal.

9. The circuit of claim 1, wherein:
    the bistable circuit operates as a master bistable circuit; and
    the circuit of claim 1 further comprises a slave bistable circuit having a data input coupled to the first of the complementary output nodes and configured to latch the state of the data input of the slave bistable circuit on the second edge of the clock signal.

10. The circuit of claim 9, further comprising:
    a second metastability correction circuit coupled to first and second complementary outputs of the slave bistable circuit, the second metastability correction circuit including:
        a second power boost circuit, configured to couple each of the first and second complementary output nodes of the slave flip-flop circuit to the power source in response to a second enable signal, the first and second complementary outputs of the slave bistable circuit being coupled to the power source in response to a first state of the second enable signal and being uncoupled from the voltage source in response to a second state of the second enable signal; and
        a second control circuit, configured to enable the second power boost circuit of the second metastability correction circuit in response to each second edge of the clock signal and disable the enabled second power boost circuit in response to detecting stable operation of the slave bistable circuit.

11. The circuit of claim 9, wherein the slave bistable circuit is not coupled to a power boost circuit.

12. The circuit of claim 10, further comprising:
    wherein the bistable circuit operates as a slave bistable circuit; and
    a master bistable circuit having an output nodes coupled to a data input of the slave bistable circuit, the master bistable circuit being configured to latch a state of a data input of the master bistable circuit on an edge of the clock signal preceding the first edge, the master bistable circuit not being coupled to a power boost circuit.

13. A metastable state resistant circuit, comprising:
    a logic circuit having two or more stable states and subject to one or more metastable states, the logic circuit configured to set an output state of the logic circuit on a first edge of a clock signal; and
    a metastability correction circuit including:
        a power boost circuit configured to couple one or more nodes of the logic circuit to a power source in response to an enable signal, the one or more nodes being coupled to the power source in response to a first state of the enable signal, and the one or more nodes being decoupled from the power source in response to a second state of the enable signal; and a control circuit configured to assert the enable signal in the first state in response to every first edge of the clock signal and assert the enable signal in the second state in response to detecting stable operation of the bistable circuit.

14. The metastable state resistant circuit of claim 13, wherein the control circuit includes:
   a metastability state detection circuit; and
   a one shot pulse generator having a trigger input coupled to receive the clock signal.

15. The metastable state resistant circuit of claim 14, wherein the control circuit further includes a transistor configured to pull down the enable signal to the first state in response to a pulse generated by the one-shot pulse generator.

16. The metastable state resistant circuit of claim 14, wherein the one-shot pulse generator circuit is configured to generate a pulse on each first edge of the clock signal.

17. The metastable state resistant circuit of claim 13, wherein the first edge of the clock signal is a rising edge.

18. The metastable state resistant circuit of claim 13, wherein the first edge of the clock signal is a falling edge.

19. The metastable state resistant circuit of claim 13, wherein the metastable correction circuit is configured to couple the one or more nodes being coupled to the power source in response to a first state of the enable by coupling each of the one or more nodes to the power source with a respective resistive path.

20. A method of operating a bistable latch, comprising:
   latching the state of input data on a first edge of a clock signal;
   in response to every first edge of the clock signal, coupling first and second complementary output nodes of the bistable latch to a power source; and
   in response to detecting stable operation of the bistable circuit, decoupling the first and second complementary output nodes of the bistable circuit from the power source.

* * * * *